United States Patent
Nakahara (10) Patent No.: US 10,515,863 B2
(45) Date of Patent: Dec. 24, 2019

(54) POWER MODULE AND POWER CONVERSION APPARATUS INCLUDING CASE AND ELASTIC MEMBER

(71) Applicant: Mitsubishi Electric Corporation, Tokyo (JP)

(72) Inventor: Kenta Nakahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/897,178

(22) Filed: Feb. 15, 2018

(65) Prior Publication Data

US 2019/0057914 A1    Feb. 21, 2019

(30) Foreign Application Priority Data

Aug. 21, 2017 (JP) ................. 2017-158750

(51) Int. Cl.
| | |
|---|---|
| *H01L 23/053* | (2006.01) |
| *H01L 23/10* | (2006.01) |
| *H01L 23/24* | (2006.01) |
| *H01L 23/40* | (2006.01) |
| *H01L 23/00* | (2006.01) |
| *H02M 1/08* | (2006.01) |
| *H02M 7/5395* | (2006.01) |

(52) U.S. Cl.
CPC ............ *H01L 23/053* (2013.01); *H01L 23/10* (2013.01); *H01L 23/24* (2013.01); *H01L 23/4006* (2013.01); *H01L 24/48* (2013.01); *H01L 2023/405* (2013.01); *H01L 2023/4031* (2013.01); *H01L 2023/4081* (2013.01); *H01L 2023/4087* (2013.01); *H01L 2224/48091* (2013.01); *H01L 2224/48106* (2013.01); *H01L 2224/48227* (2013.01); *H01L 2924/1203* (2013.01); *H01L 2924/13055* (2013.01); *H01L 2924/1425* (2013.01); *H02M 1/08* (2013.01); *H02M 7/5395* (2013.01)

(58) Field of Classification Search
CPC .................. H01L 23/053; H01L 23/10; H01L 2224/48106; H01L 24/48
See application file for complete search history.

(56) References Cited

U.S. PATENT DOCUMENTS

| | | | | |
|---|---|---|---|---|
| 6,085,962 A | * | 7/2000 | Jacobson | ............ B23K 20/004 228/103 |
| 6,642,576 B1 | * | 11/2003 | Shirasawa | ............ H01L 25/071 257/288 |

(Continued)

FOREIGN PATENT DOCUMENTS

JP      06-045515 A      2/1994

*Primary Examiner* — Allen L Parker
*Assistant Examiner* — Gustavo G Ramallo
(74) *Attorney, Agent, or Firm* — Studebaker & Brackett PC (57) ABSTRACT

According to the present invention, a power module includes an insulating substrate, a semiconductor device provided on the insulating substrate, an internal terminal provided on the insulating substrate and electrically connected to the semiconductor device, a sealing material that seals the internal terminal, the semiconductor device and the insulating substrate so that an end portion of the internal terminal is exposed, a case that is separate from the sealing material and covers the sealing material and an elastic member that connects the case and the end portion of the internal terminal.

11 Claims, 5 Drawing Sheets

(56) References Cited

U.S. PATENT DOCUMENTS

| | | | | |
|---|---|---|---|---|
| 2001/0042913 | A1* | 11/2001 | Fukuda | H01L 21/565 257/697 |
| 2004/0012064 | A1* | 1/2004 | Yoshizaki | H01L 23/051 257/448 |
| 2005/0257746 | A1* | 11/2005 | Shirakawa | C23C 14/50 118/728 |

* cited by examiner

POWER MODULE AND POWER CONVERSION APPARATUS INCLUDING CASE AND ELASTIC MEMBER

BACKGROUND OF THE INVENTION

Field

The present invention relates to a structure of a power module and a power conversion apparatus provided with the power module.

Background

When a power module fails, the power module body and its peripheral components need to be replaced, and it is therefore considered necessary to improve operability of power module replacement and reduce a cost incurred in the replacement. According to JP 6-45515 A, in order to facilitate removal of a control substrate from an insulating substrate on which a semiconductor device is mounted, a case that covers the insulating substrate on which the semiconductor device is mounted and the control substrate are connected together via an elastic member.

In the case of the power module described in JP 6-45515 A, since the insulating substrate (power section) on which the semiconductor device is mounted and the case are integrally formed by sealing resin, the removal is not easy, and in the case where the semiconductor device fails, the case which is normally functioning needs also to be replaced. Particularly in and around the semiconductor device which is a heat generation source, parts are likely to be replaced more often than in and around the case, and so if the insulating substrate on which the semiconductor device is mounted and the case cannot be easily removed, this may result in a problem that an extra cost would be incurred in the replacement.

SUMMARY

The present invention has been implemented to solve the above-described problem, and it is an object of the present invention to provide a power module that can easily remove an insulating substrate on which a semiconductor device is mounted and a case.

The features and advantages of the present invention may be summarized as follows.

According to the present invention, a power module includes an insulating substrate, a semiconductor device provided on the insulating substrate, an internal terminal provided on the insulating substrate and electrically connected to the semiconductor device, a sealing material that seals the internal terminal, the semiconductor device and the insulating substrate so that an end portion of the internal terminal is exposed, a case that is separate from the sealing material and covers the sealing material and an elastic member that connects the case and the end portion of the internal terminal.

Other and further objects, features and advantages of the invention will appear more fully from the following description.

DESCRIPTION OF EMBODIMENTS

First Embodiment

Figure 1:
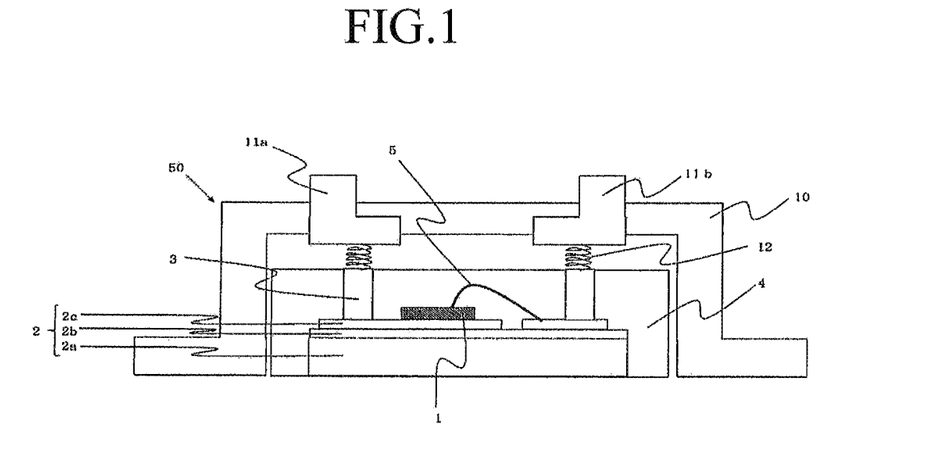
FIG. 1 is a cross-sectional view illustrating a power module of the first embodiment.

A power module 50 according to a first embodiment will be described. FIG. 1 is a cross-sectional view illustrating the power module 50 of the first embodiment. Note that in the drawings other than FIG. 1, the same reference numerals denote the same or corresponding parts. In the power module 50 shown in FIG. 1, a power section is constructed of a semiconductor device 1, an insulating substrate 2, an internal terminal 3 and a conductive wire 5. The power module 50 includes the power section in which the semiconductor device 1 is joined to the insulating substrate 2 via a conductive member and resin-sealed with a sealing material 4, and a case 10, and the power module 50 is configured such that an end portion of the internal terminal 3 is exposed from the sealing material 4 and connected to the elastic member 12. Note that the semiconductor device 1 may be a switching device or a diode, and may be, for example, an IGBT (Insulated Gate Bipolar Transistor) or a PN diode. The number of the semiconductor devices is naturally not limited to one, and may be two or more.

The insulating substrate 2 is constructed of a base plate 2a, an insulating layer 2b and a circuit pattern 2c. The insulating layer 2b is provided on the base plate 2a. The circuit pattern 2c is provided on the insulating layer 2b. The base plate 2a and the circuit pattern 2c are formed of, for example, copper. The insulating layer 2b secures electrical insulation of the power module 50 from the outside, and may be formed of, for example, an inorganic ceramic material or a material in which ceramic powder is dispersed in thermosetting resin such as epoxy resin.

One end of the internal terminal 3 is electrically connected to the circuit pattern 2c and the other end is used to exchange an electric signal with the outside of the power section. The internal terminal 3 is electrically connected to a back surface electrode of the semiconductor device 1 via the circuit pattern 2c. A front surface electrode of the semiconductor device 1 is electrically connected to the circuit pattern 2c via the conductive wire 5. Note that the internal terminal 3 needs only to be conductive, and may be, for example, a copper block.

The insulating substrate 2, the internal terminal 3, the conductive wire 5 and the semiconductor device 1 are covered with the sealing material 4. Although the internal terminal 3 is covered with the sealing material 4, the end portion of the internal terminal 3 is exposed from a surface of the sealing material 4 to exchange a signal with the outside. Since the back surface of the insulating substrate 2 is cooled with a heat sink or the like, it can be exposed from the sealing material 4. The material of the sealing material 4 is not particularly limited as long as it has insulating properties, and may be, for example, epoxy resin.

The power section and the sealing material 4 are surrounded by the case 10. The case 10 is separate from the sealing material 4. Note that it is preferred that the case 10 and the sealing material 4 should not be integrally formed, and the case 10 and the sealing material 4 may be in contact with each other. When the case 10 is in contact with the sealing material 4, there is no gap between the case 10 and the sealing material 4, and it is thereby possible to make the power module 50 smaller. Note that when there is a gap between the case 10 and the sealing material 4, it is possible to absorb the dimensional tolerance between the case 10 and the sealing material 4 and thereby improve the degree of freedom of the product design. The case 10 is formed of plastic resin or the like, and so the external terminal 11 (11a, 11b) is insert molded into the case 10. The external terminal 11 is used for the case 10 to exchange an electric signal with the outside. Note that the external terminal 11 may also be outsert molded into the case 10.

One end of the elastic member 12 is elastically connected to the internal terminal 3 on the insulating substrate 2 on which the semiconductor device 1 is mounted and the other end is elastically connected to the case 10. In the first embodiment, the elastic member 12 is a coil spring and may be formed integrally with the case 10. Note that the elastic member 12 may be insert molded into the case and may thereby be formed integrally with the external terminal 11. Furthermore, the elastic member 12 needs only to have elasticity and conductivity and the elastic member 12 may be a plurality of coil springs according to a current capacity.

Figure 2:
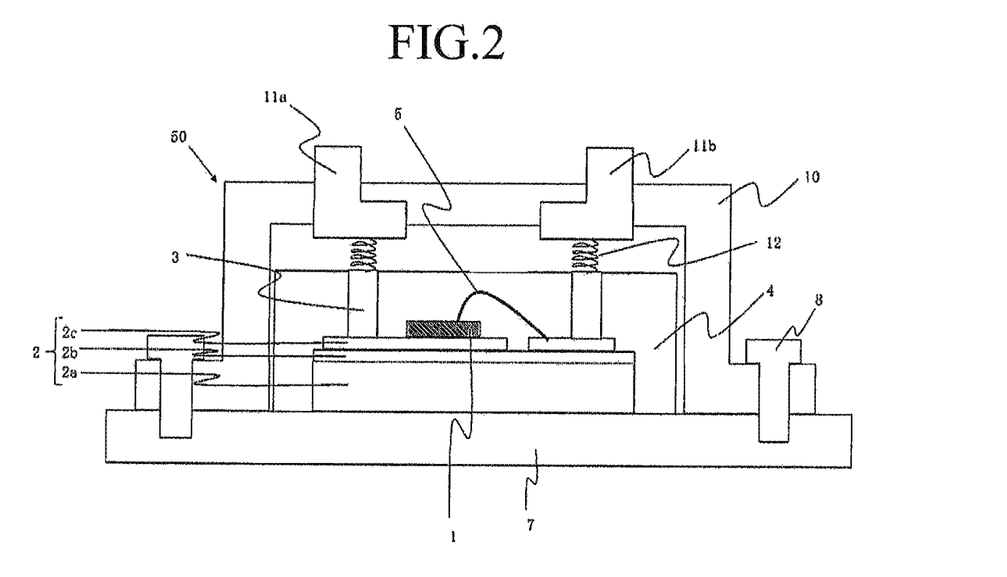
FIG. 2 is a cross-sectional view illustrating the power module according to the first embodiment attached to a heat sink.

FIG. 2 illustrates the power module 50 pressed against a heat sink 7. Part of the case of the power module 50 has a mounting hole and the power module 50 is attached to the heat sink 7 via a screw 8 which is passed through the mounting hole. Furthermore, the power module 50 is attached to the heat sink 7 via grease or a heat dissipation sheet on a back surface of the base plate 2a. Note that the heat dissipation sheet requires no wiping operation compared to grease and preferably has a thickness of 0.1 mm or less and thermal conductivity of 1 W/mK or greater.

In FIG. 1, the semiconductor device 1 is an IGBT and a circuit configuration will be described where a diode, though not shown in FIG. 1, is positioned on the circuit pattern 2c in a direction perpendicular to the sheet surface and each IGBT is connected to a diode in parallel. An external terminal 11a is a P terminal of the power module 50 and is electrically connected to a collector electrode which is the back surface electrode of the semiconductor device 1 via the elastic member 12, the internal terminal 3 and the circuit pattern 2c. An emitter electrode which is the front surface electrode of the semiconductor device 1 is electrically connected to the circuit pattern 2c via the conductive wire 5. An external terminal 11b is an N terminal of the power module 50 and is electrically connected to the circuit pattern 2c via the internal terminal 3 and the elastic member 12. Furthermore, the collector electrode of the semiconductor device 1 is electrically connected to a cathode electrode of the diode and the emitter electrode of the semiconductor device 1 is electrically connected to an anode electrode of the diode to form a parallel circuit of a 1-in-1 module. It goes without saying that a circuit different from the aforementioned circuit configuration may also be formed, and, for example, a half bridge circuit of a 2-in-1 module or a three-phase inverter circuit of a 6-in-1 module may be formed. Note that the external terminal 11 may be an output terminal depending on the circuit configuration.

According to the power module 50 of the first embodiment, the internal terminal 3 on the insulating substrate 2 on which the semiconductor device 1 is mounted is connected to the case 10 via the elastic member 12, and if the semiconductor device 1 fails, it is possible to easily remove the insulating substrate 2 and the case 10, and replace the insulating substrate 2 on which the semiconductor device 1 is mounted, providing an effect of reducing the operation cost required for replacement or the member cost and improving efficiency of member replacement operation. When the power module 50 is attached to the heat sink 7, the internal terminal 3 on the insulating substrate 2 is connected to the case 10 via the elastic member 12, and therefore even when there are dimensional variations in the respective members connected to the elastic member 12, the elastic member 12 absorbs the variations, providing an effect of being able to secure a contact pressure between the power module 50 and the heat sink 7.

Second Embodiment

Figure 3:
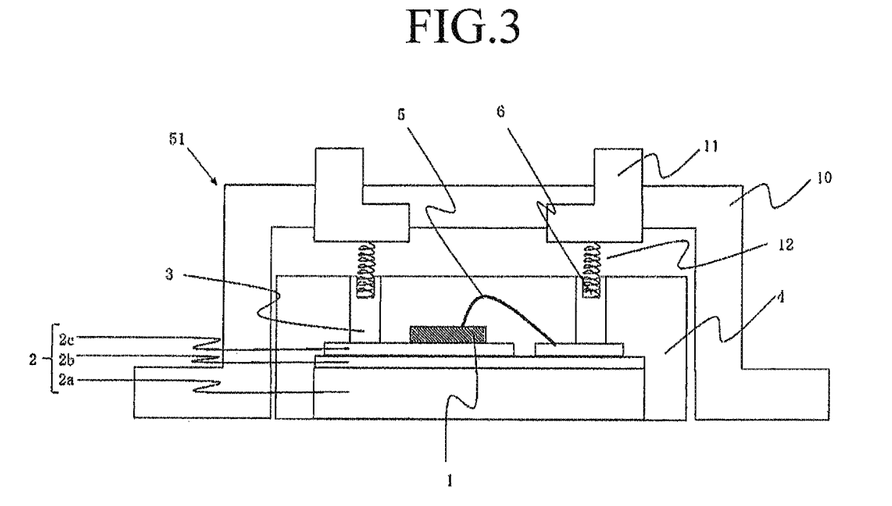
FIG. 3 is a cross-sectional view illustrating a power module of the second embodiment.

A power module 51 according to a second embodiment will be described. FIG. 3 is a cross-sectional view illustrating the power module 51 of the second embodiment. In the power module 51 of the second embodiment, a concave portion 6 is formed at an end portion of the internal terminal 3 exposed from the sealing material 4.

According to the power module 51 of the second embodiment, the concave portion 6 is formed at the end portion of the internal terminal 3 exposed from the sealing material 4. Since the elastic member 12 is inserted into the concave portion 6, a current can be supplied not only from a bottom surface of the concave portion 6 but also from a side face, and it is thereby possible to improve a current conduction area and increase a current capacity of the power module 51. When the power module 51 is attached to the heat sink 7, since the elastic member 12 is supported by the concave portion 6, the power module 51 can be easily attached to the heat sink 7.

Third Embodiment

Figure 4:
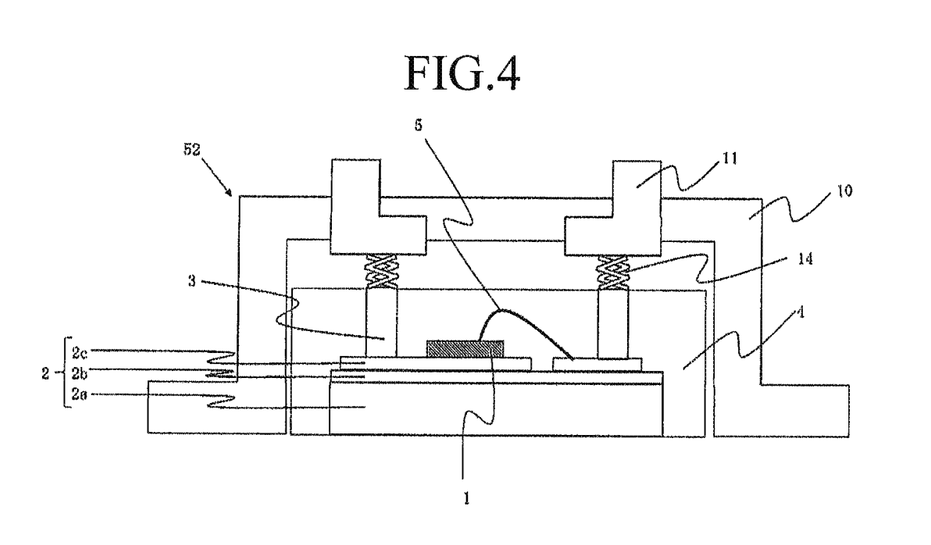
FIG. 4 is a cross-sectional view illustrating a power module of the third embodiment.
Figure 5:
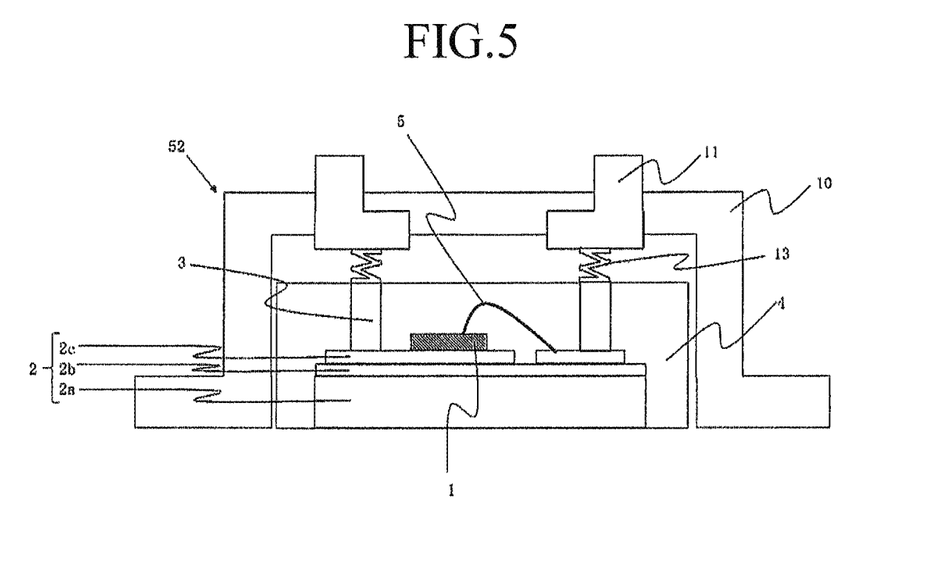
FIG. 5 is a cross-sectional view illustrating the power module according to the third embodiment provided with a plate spring.

A power module 52 according to a third embodiment will be described. FIG. 4 is a cross-sectional view illustrating the power module 52 of the third embodiment. The power module 52 of the third embodiment is characterized in that the elastic member is made up of a multi-contact spring 14. Note that the multi-contact spring 14 needs only to have a plurality of contacts and may be a coiled wave spring in which a wave shape is added to a spiral coil spring or a plate spring 13 as shown in FIG. 5.

According to the power module 52 of this third embodiment, since the elastic member is the multi-contact spring 14, the contact area with respect to the coil spring increases, thereby making it possible to improve the current conduction area and increase a current capacity of the power module 52. Furthermore, since the multi-contact spring 14 can generate a greater elastic force than the coil spring at a shorter stroke, the power module 52 can be easily attached to the heat sink 7. Furthermore, while it is necessary to use a plurality of coil springs to increase the contact area, the number of parts can be reduced to one in the case of the multi-contact spring 14, making it possible to reduce the weight of members.

Fourth Embodiment

Figure 6:
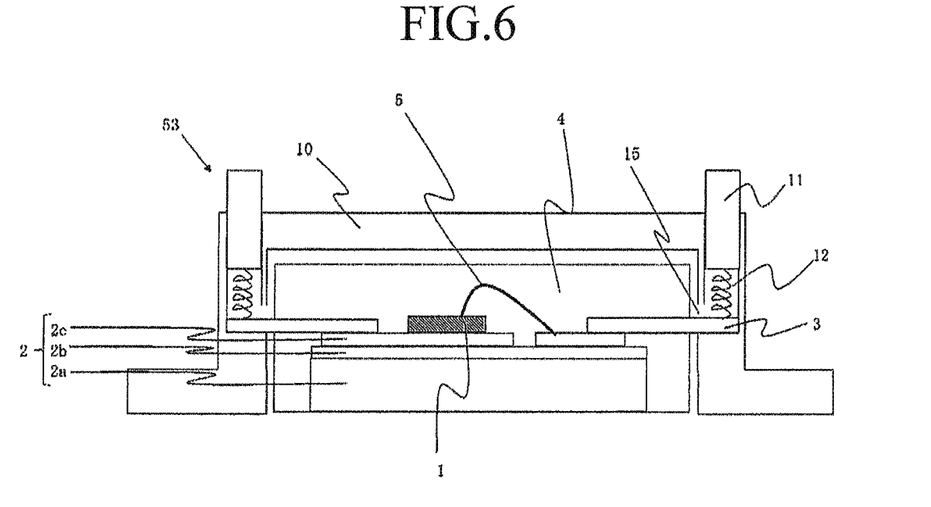
FIG. 6 is a cross-sectional view illustrating a power module of the fourth embodiment.

A power module 53 according to a fourth embodiment will be described. FIG. 6 is a cross-sectional view illustrating a power module 53 of the fourth embodiment. The power module 53 of the fourth embodiment is provided with a hole 15 in the case 10, the end portion of the internal terminal 3 exposed from a side face of the sealing material 4 is inserted into the hole 15, and the elastic member 12 electrically connects the external terminal 11 and the end portion of the internal terminal 3 inside the case 10.

One end of the hole 15 is provided on an inside surface of the case 10 facing the side face of the sealing material 4 and the other end is provided on a top surface of the case 10. Note that the elastic member 12 is provided along the hole 15 and elastically deformable in the direction in which the heat sink 7 is attached. When the sealed power section is attached to the case 10, the internal terminal 3 is made to slide in the direction perpendicular to the sheet surface and inserted into the hole 15.

Figure 7:
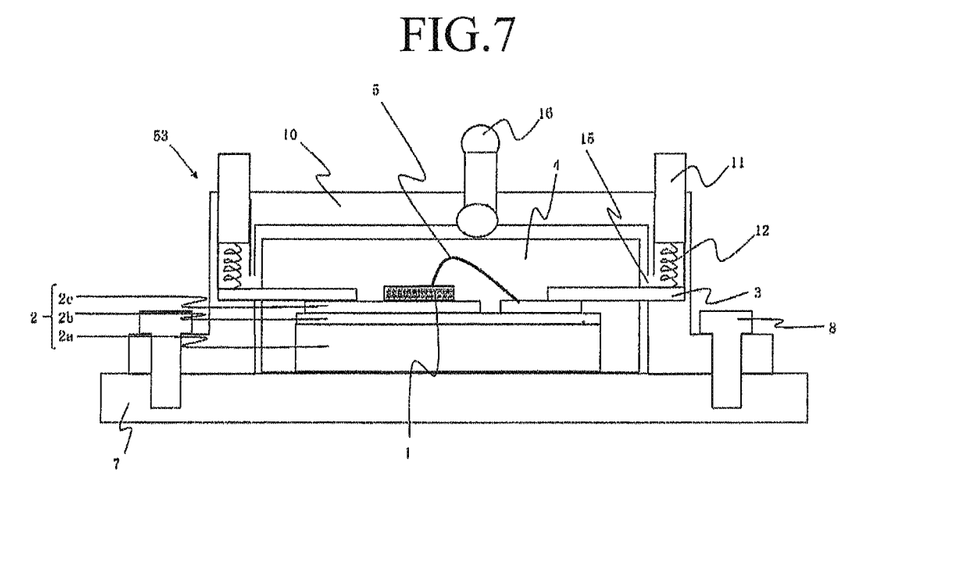
FIG. 7 is a cross-sectional view illustrating the power module according to the fourth embodiment including a clamp.
Figure 8:
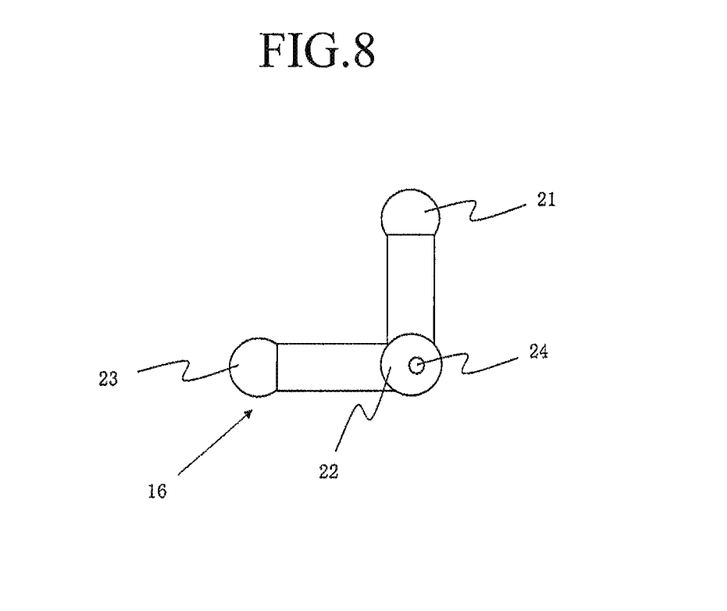
FIG. 8 is a cross-sectional view illustrating the clamp.

Furthermore, as shown in FIG. 7, a clamp 16 may be formed integrally with the case 10. As shown in FIG. 8, the clamp 16 is constructed of an operation portion 21, a fulcrum portion 22 and a pressing portion 23. A shaft 24 is passed through the fulcrum portion 22 so that the operation portion 21 and the pressing portion 23 may rotate around the fulcrum portion 22. The shaft 24 is supported by the case 10. Clamp operation is performed while the power module 53 is fixed to the heat sink 7. When the operation portion 21 rotates around the shaft 24, the pressing portion 23 also rotates and a force is applied in a direction in which the heat sink 7 is pressed.

According to the power module 53 of this fourth embodiment, since the internal terminal 3 is exposed from the side face of the sealing material 4 and is connected to the external terminal 11 inside of the case 10 via the elastic member 12, when the semiconductor device 1 fails, it is possible to easily remove the insulating substrate 2 on which the semiconductor device 1 is mounted and the case 10 and replace the insulating substrate 2 on which the semiconductor device 1 is mounted, and it is thereby possible to provide an effect of reducing a replacement-related operation cost and a member cost and improving efficiency of the member replacement operation. Furthermore, since the clamp 16 is formed integrally with the case 10, when the power module 53 is attached to the heat sink 7, it is possible to easily press the heat sink 7 against the power module 53 and thereby improve efficiency of the member replacement operation.

Fifth Embodiment

In the present embodiment, the aforementioned power module according to the first to fourth embodiments is applied to a power conversion apparatus. Although the present invention is not limited to a specific power conversion apparatus, a case will be described hereinafter as a fifth embodiment where the present invention is applied to a three-phase inverter.

Figure 9:
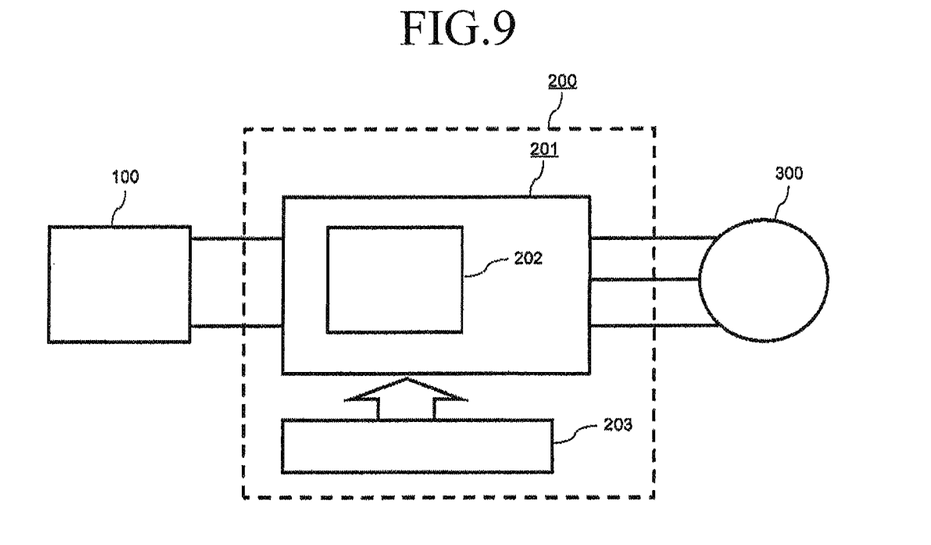
FIG. 9 is a block diagram illustrating a configuration of a power conversion system.

FIG. 9 is a block diagram illustrating a configuration of a power conversion system to which the power conversion apparatus according to the present embodiment is applied.

The power conversion system shown in FIG. 9 is constructed of a power supply 100, a power conversion apparatus 200 and a load 300. The power supply 100 is a DC power supply and supplies DC power to the power conversion apparatus 200. The power supply 100 can be constructed of various components, and can be constructed of, for example, a DC system, a solar battery and a storage battery or may be constructed of a rectification circuit connected to an AC system or an AC/DC converter. The power supply 100 may also be constructed of a DC/DC converter that converts DC power outputted from the DC system to predetermined power.

The power conversion apparatus 200 is a three-phase inverter connected between the power supply 100 and the load 300, converts DC power supplied from the power supply 100 to AC power and supplies AC power to the load 300. As shown in FIG. 9, the power conversion apparatus 200 is provided with a main conversion circuit 201 that converts DC power to AC power and outputs the AC power and a control circuit 203 that outputs a control signal for controlling the main conversion circuit 201 to the main conversion circuit 201.

The load 300 is a three-phase electric motor driven with AC power supplied from the power conversion apparatus 200. Note that the load 300 is not limited to a specific application, but is an electric motor mounted on various types of electric apparatuses, and used as an electric motor intended for hybrid automobile, electric vehicle, railroad vehicle, elevator or air-conditioner or the like.

Hereinafter, details of the power conversion apparatus 200 will be described. The main conversion circuit 201 is provided with a switching device and a reflux diode (not shown), in which when the switching device performs switching, DC power supplied from the power supply 100 is converted to AC power and supplied to the load 300. There are a variety of types of specific circuit configuration of the main conversion circuit 201, and the main conversion circuit 201 according to the present embodiment is a two-level three-phase full bridge circuit, and can be constructed of six switching devices and six reflux diodes arranged reversely parallel to the respective switching devices. The aforementioned power module according to any one of the first to fourth embodiments is applied to at least any one of the respective switching devices and the respective reflux diodes of the main conversion circuit 201. Every two switching devices of the six switching devices are connected in series to form upper and lower arms, the upper and lower arms forming the respective phases (U-phase, V-phase and W-phase) of a full bridge circuit. Output terminals of the respective upper and lower arms, that is, three output terminals of the main conversion circuit 201 are connected to the load 300.

Furthermore, the main conversion circuit 201 is provided with a drive circuit (not shown) that drives each switching device, but the drive circuit may be incorporated in the power module 202 or a configuration including a drive circuit separately from the power module 202 may also be adopted. The drive circuit generates a drive signal for driving the switching device of the main conversion circuit 201 and supplies the drive signal to the control electrode of the switching device of the main conversion circuit 201. More specifically, the drive circuit outputs a drive signal for setting the switching device to an ON state and a drive signal for setting the switching device to an OFF state to the control electrode of each switching device following the control signal from the control circuit 203 described below. When the switching device is kept in the ON state, the drive signal is a voltage signal (ON signal) equal to or higher than a threshold voltage of the switching device, and when the switching device is kept in the OFF state, the drive signal is a voltage signal (OFF signal) equal to or lower than a threshold voltage of the switching device.

The control circuit 203 controls the switching device of the main conversion circuit 201 so that desired power is supplied to the load 300. More specifically, the control circuit 203 calculates a time (ON time) during which each switching device of the main conversion circuit 201 should be set to an ON state based on the power to be supplied to the load 300. For example, the control circuit 203 can control the main conversion circuit 201 according to PWM control whereby the ON time of the switching device is modulated in accordance with the voltage to be outputted. A control command (control signal) is outputted to the drive circuit provided for the main conversion circuit 201 so that an ON signal is outputted to the switching device to be set to an ON state and an OFF signal is outputted to the switching device to be set to an OFF state at each time point. The drive circuit outputs an ON signal or an OFF signal to the control electrode of each switching device as a drive signal in accordance with this control signal.

Since the power conversion apparatus according to the present embodiment applies the power module according to the first to fourth embodiments as the switching device and the reflux diode of the main conversion circuit 201, by connecting the terminal on the insulating substrate on which the semiconductor device is mounted and the case using an elastic member, when the semiconductor device fails, it is possible to easily remove the insulating substrate and the case and replace the insulating substrate on which the semiconductor device is mounted, thus providing an effect of reducing a replacement-related operation cost and a member cost, and improving the efficiency of the member replacement operation.

Although an example has been described in the present embodiment where the present invention is applied to a two-level three-phase inverter, the present invention is not limited to this, but the present invention is applicable to various types of power conversion apparatuses. Although a two-level power conversion apparatus is assumed in the present embodiment, a three-level or a multilevel power conversion apparatus may also be adopted or the present invention may be applied to a single-phase inverter when power is supplied to a single-phase load. Furthermore, the present invention may also be applicable to a DC/DC converter or an AC/DC converter when power is supplied to a DC load or the like.

The power conversion apparatus to which the present invention is applied is not limited to the aforementioned case where the load is an electric motor, but the present invention can also be used as, for example, a power supply apparatus for an electric discharge machine, laser processing machine, an induction heating cooking device or non-contact power supply system or further a power conditioner such as a photovoltaic power generation system or a power storage system.

Note that the present invention can freely combine various embodiments and modifications within the scope of the invention and modify or omit the respective embodiments as appropriate.

For the conductive member for joining between parts, it is preferable to use a solder, a metal paste using a metal filler or metal with low electric resistance such as fired metal which is metallized with heat.

In the power module according to the present invention, the insulating substrate on which the semiconductor device is mounted is sealed separately from the case and the sealed insulating substrate and the case are connected via the elastic member, and so the substrate and the case can be easily removed.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2017-158750, filed on Aug. 21, 2017 including specification, claims, drawings and summary, on which the Convention priority of the present application is based, are incorporated herein by reference in its entirety.

The invention claimed is:

1. A power module comprising:
an insulating substrate;
a semiconductor device provided on the insulating substrate;
an internal terminal provided on the insulating substrate and electrically connected to the semiconductor device;
a sealing material that seals the internal terminal, the semiconductor device and the insulating substrate so that an end portion of the internal terminal is exposed;
a case that is separate from the sealing material and covers the sealing material; and
an elastic member that electrically connects a part of the case and the end portion of the internal terminal.

2. The power module according to claim 1, wherein the sealing material is in contact with the case.

3. The power module according to claim 1, wherein a concave portion into which the elastic member is inserted is provided at the end portion of the internal terminal.

4. The power module according to claim 1, wherein the elastic member is a multi-contact spring having a plurality of contacts.

5. The power module according to claim 1, further comprising a heat sink that is pressed against a back surface of the insulating substrate and the case, wherein the back surface of the insulating substrate is exposed from the case and the sealing material.

6. The power module according to claim 1, wherein the case supports a shaft and is provided with a clamp including an operation portion that rotates around the shaft and a pressing portion.

7. A power conversion apparatus comprising:
a main conversion circuit that includes the power module according to claim 1, and converts and outputs inputted power; and
a control circuit that outputs a control signal for controlling the main conversion circuit to the main conversion circuit.

8. The power module according to claim 1, wherein the case is attached to a heat sink through at least one screw.

9. A power module comprising:
an insulating substrate;
a semiconductor device provided on the insulating substrate;
an internal terminal provided on the insulating substrate and electrically connected to the semiconductor device;
a sealing material that seals the internal terminal, the semiconductor device and the insulating substrate so that an end portion of the internal terminal is exposed;
a case that is separate from the sealing material and covers the sealing material;
an elastic member that connects the case and the end portion of the internal terminal; and an external terminal, one end of which is electrically connected to the internal terminal via the elastic member and the other end of which is exposed from the case, wherein one end of a hole is provided on an inside surface of the case facing a side face of the sealing material, the other end of the hole is provided on a top surface of the case so as to communicate with the top surface and the end portion of the internal terminal is exposed from the side face of the sealing material and inserted into the hole, and the elastic member is connected to the end portion of the internal terminal inside the case and elastically provided along the hole.

10. A power module comprising:

an insulating substrate;

a semiconductor device provided on the insulating substrate;

an internal terminal provided on the insulating substrate and electrically connected to the semiconductor device;

a sealing material that seals the internal terminal, the semiconductor device and the insulating substrate so that an end portion of the internal terminal is exposed;

a case that is separate from the sealing material and covers the sealing material;

an external terminal that is attached to the case; and an elastic member that electrically connects the external terminal and the end portion of the internal terminal.

11. The power module according to claim 10, wherein the case is attached to a heat sink through at least one screw.

* * * * *